United States Patent [19]

Satoh

[11] Patent Number: 5,214,681
[45] Date of Patent: May 25, 1993

[54] FREQUENCY-DIVIDER CIRCUIT WITH INPUT SIGNAL LEVEL OFFSET CONTROL

[75] Inventor: Fumio Satoh, Itami, Japan

[73] Assignee: Mitsubishi Denki Kabushiki Kaisha, Tokyo, Japan

[21] Appl. No.: 788,227

[22] Filed: Nov. 5, 1991

[30] Foreign Application Priority Data

Nov. 26, 1990 [JP] Japan ................. 2-324261

[51] Int. Cl.$^5$ ........................... H03K 21/02
[52] U.S. Cl. .......................... 377/47; 377/48
[58] Field of Search .................... 377/47, 48

[56] References Cited

U.S. PATENT DOCUMENTS

| | | | |
|---|---|---|---|
| 4,656,649 | 4/1987 | Takahashi | 377/48 |
| 4,820,993 | 4/1989 | Cohen et al. | |
| 4,845,727 | 7/1989 | Murray | 377/47 |
| 5,077,764 | 12/1991 | Yamashita | 377/48 |
| 5,084,907 | 1/1992 | Maemura | 377/48 |

Primary Examiner—William L. Sikes
Assistant Examiner—Scott A. Ouellette
Attorney, Agent, or Firm—Morrison Law Firm

[57] ABSTRACT

Judgment means provides a first output alternating signal to a ÷2 frequency-divider and also a frequency-division control signal at a first level to operate the ÷2 frequency-divider, when a first input alternating signal is applied to an input terminal. The first output alternating signal frequency divided by the ÷2 frequency divider is applied to an NOR gate, to which a first gate control signal is applied from the judgment means so as to allow the frequency divided first output alternating signal to pass the NOR gate. When a second input alternating signal is applied to the input terminal, the judgment means provides the frequency-division control signal at a second level to the ÷2 frequency-divider which, in turn, provides a second gate control signal to the NOR gate. At this time, the judgment means also provides a second output alternating signal to the NOR gate. The NOR gate with the second gate control signal applied thereto passes the second output alternating signal therethrough. The first and second input alternating signals alternate about different reference levels.

17 Claims, 9 Drawing Sheets

FREQUENCY-DIVIDER CIRCUIT WITH INPUT SIGNAL LEVEL OFFSET CONTROL

The present invention relates to a frequency-divider circuit for dividing the frequency of an input signal applied thereto, and, more particularly to such a frequency-divider circuit in which the frequency dividing factor is variable.

BACKGROUND OF THE INVENTION

Figure 1:
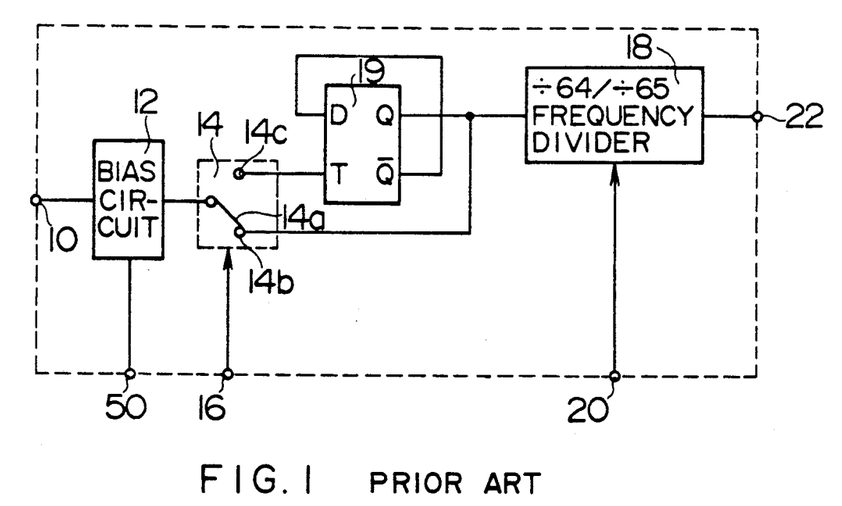
FIG. 1 is a block diagram of a conventional variable frequency-divider circuit.

A frequency-divider having a variable frequency dividing factor (hereinafter variable frequency-divider) may be used as a pulse-swallow type prescaler in a PLL. An example of such variable frequency-dividers which have been conventionally used is shown in FIG. 1. The variable frequency-divider shown in FIG. 1 is in a semiconductor integrated circuit form. The variable frequency-divider of FIG. 1 has switchable frequency dividing factors of 64, 65, 128 and 130. A high frequency signal applied at an input terminal 10 is fed to a bias circuit 12 which provides a predetermined bias to the high frequency signal to ensure stable frequency-dividing operations in a $\div 2$ (divide-by-2) frequency-divider 19 and a $\div 64$(divide-by-64)/$\div 65$(divide-by-65) frequency-divider 18 which are described later. The biased high frequency signal from the circuit 12 is applied to an electronic switch 14. The electronic switch 14 has its movable contact 14a connected to a fixed contact 14b when a frequency dividing factor switching signal at a low (L) level is applied to a frequency dividing factor switching terminal 16. The movable contact 14a of the electronic switch 14 is connected to a fixed contact 14c when the frequency dividing factor switching signal applied to the terminal 16 is at a high (H) level. The contact 14b is connected to the input of the $\div 64/\div 65$ frequency-divider 18, whereas the fixed contact 14c is connected to the $\div 2$ frequency-divider 19, which has its output coupled to the $\div 64/\div 65$ frequency-divider 18. The $\div 64/\div 65$ frequency-divider 18 divides the frequency of a signal applied thereto by a factor of 64, when a mode switching signal at a low (L) level is applied to a mode switching terminal 20, whereas it performs divide-by-65 operation when the mode switching signal applied to the terminal 20 is at a high (H) level. Thus, when the low-level frequency dividing factor switching signal is applied to the frequency dividing factor switching terminal 16 and, at the same time, a low-level mode switching signal is applied to the mode switching terminal 20, the high frequency signal from the bias circuit 12 is applied through the electronic switch 14 to the $\div 64/\div 65$ frequency-divider 18, where it is frequency-divided by 64 and is developed at an output terminal 22. When the high-level mode switching signal is applied to the terminal 20 with low-level frequency dividing factor switching signal being applied to the terminal 16, the high frequency signal from the bias circuit 12 is applied through the switch 14 to the frequency-divider 18, where it is frequency-divided by 65. When the high-level frequency dividing factor switching signal is applied to the frequency dividing factor switching terminal 16 and the low-level mode switching signal is applied to the mode switching terminal 20, the high frequency signal from the bias circuit 12 is coupled through the electronic switch 14 to the $\div 2$ frequency-divider 19 where it is divided by a factor of 2. The output of the $\div 2$ frequency-divider 19 is applied to the $\div 64/\div 65$ frequency-divider 18 and is frequency-divided by 64. In other words, the high frequency signal from the bias circuit 12 is ultimately frequency-divided by 128. When the high-level mode switching signal is applied to the terminal 16 with the high-level frequency dividing factor switching signal being applied to the terminal 20, the high frequency signal from the bias circuit 12 is coupled through the electronic switch 14 to the $\div 2$ frequency-divider 19 where it is divided by 2. The thus frequency-divided signal is then coupled to the $\div 64/\div 65$ frequency-divider 18 and is frequency-divided by 65. In other words, the frequency of the high frequency signal is ultimately divided by 130.

Figure 2:
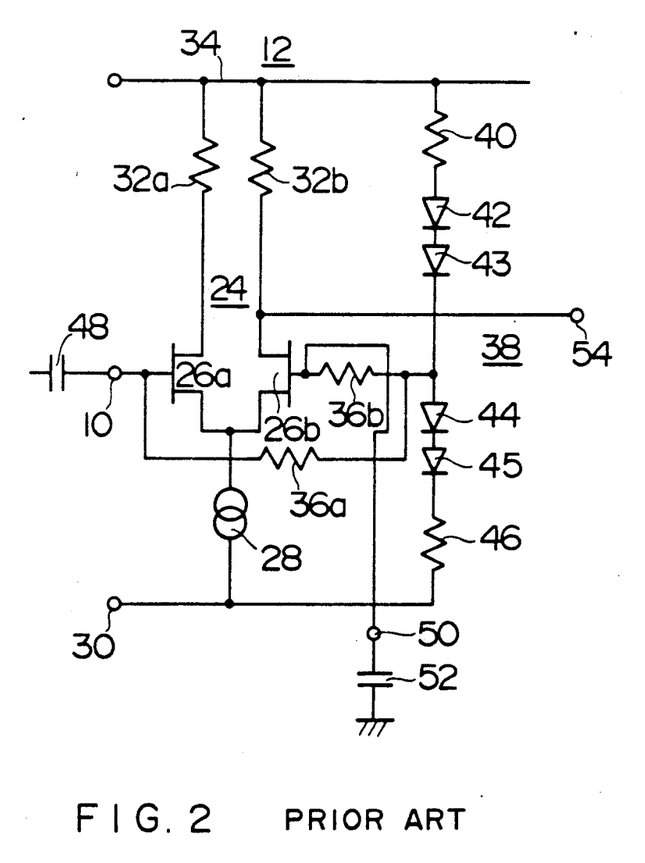
FIG. 2 is a circuit diagram of a bias circuit for use in the variable frequency-divider circuit of FIG. 1.

The bias circuit 12 may include a differential amplifier 24 as shown in FIG. 2. The differential amplifier 24 includes two MESFET's 26a and 26b having their source connected together to a reference potential point 30 through a constant current source 28, having their drains connected through associated resistors 32a and 32b to a voltage supply line 34, and having their gates supplied with a bias voltage generated by a bias voltage generating circuit 38 through respective resistors 36a and 36b of the same resistance value. The bias voltage generating circuit 38 includes a series combination of a resistor 40, diodes 42, 43, 44 and 45 and a resistor 46 connected in the named order from the voltage supply line 34 to the reference potential point 30. A voltage developed at the junction between the diodes 43 and 44 is applied through the respective resistors 36a and 36b to the gates of MESFET's 26a and 26b as their bias voltage. The gate of the MESFET 26a is connected to the input terminal 10 to which the high frequency signal is applied through a capacitor 48 which is external to the frequency-divider circuit. The gate of the MESFET 26b is connected to an AC grounding terminal 50 which is grounded through a capacitor 52 external to the frequency-divider circuit. The drain of the MESFET 26b is connected to an output terminal 54 of the bias circuit 12, which terminal 54 is connected to the movable contact 14a of the electronic switch 14.

In the bias circuit 12, the predetermined bias voltage is applied to the gates of the MESFET's 26a and 26b from the bias voltage generating circuit 38, and equal drain currents flow from the drains to the sources of the respective MESFET's 26a and 26b. A constant voltage which is equal to the voltage on the voltage supply line 34 minus a voltage drop across the resistor 32b is developed at the output terminal 54. The gate of the MESFET 26b is AC conductively grounded through the capacitor 52, while the high frequency signal DC-blocked by the capacitor 48 is applied to the gate of the MESFET 26a. When the high frequency signal is positive, the drain current of the MESFET 26a increases and the drain current of the MESFET 26b decreases, so that the voltage drop across the resistor 32b is reduced, which results in an increase in the voltage at the terminal 54. On the other hand, when the high frequency signal is negative, the drain current of the MESFET 26a decreases and the drain current of the MESFET 26b increases. Then the voltage drop across the resistor 32b increases, so that the voltage at the output terminal 54 decreases. Thus, a high frequency signal varying about the above-stated constant voltage is developed at the output terminal.

The above-described frequency-divider circuit requires two terminals, namely, the frequency dividing factor switching terminal 16 and the mode switching terminal 20, for switching the frequency dividing factor. In addition, the bias circuit 12 requires the AC grounding terminal 50. Recently, it has been tried to reduce dimensions of semiconductor integrated circuit packages for such frequency-divider circuits, and, accordingly, it is desired to reduce the number of terminals as much as possible.

An object of the present invention is to provide a frequency dividing factor switchable frequency-divider circuit without terminals corresponding to the frequency dividing factor switching terminal 16 and the AC grounding terminal 50 of the bias circuit 12.

SUMMARY OF THE INVENTION

In order to achieve the above-described objective, a frequency-divider circuit according to a first aspect of the present invention includes a single input terminal to which a first input alternating signal alternating about a first reference level, or a second input alternating signal alternating about a second reference level different from the first reference level is applied. Judgment means is provided, which, when the first input alternating signal is applied to said input terminal, develops a first output alternating signal at a first output point, a first gate control signal at a second output point, and a frequency-division control signal at a first level at a third output point, and, when the second input alternating signal is applied to the input terminal, develops a second output alternating signal at the second output point, and the frequency-division control signal at a second level at the third output point. Frequency divider means frequency-divides the first output alternating signal from the first output point by a predetermined factor to provide a frequency-divided signal when the frequency-division control signal is applied thereto from the judgment means, and generates a second gate control signal when the frequency-division control signal is applied thereto from the judgment means. The output from the frequency dividing means and the output from the second output point of the judgment means are applied to gate means. When the output from the frequency-divider means is the frequency-divided signal and the output from the second output point of the judgment means is the first gate control signal, the gate means permits the frequency-divided signal to pass therethrough, and when the output from the frequency-divider means is the second gate control signal and the output from the second output point of the judgment means is the second output alternating signal, the gate means permits the second output alternating signal therethrough.

According to another aspect of the present invention, the frequency-divider circuit is further provided with a control terminal to which a frequency dividing factor altering signal at a first or second level is applied, and frequency-divider means having a variable frequency dividing factor, i.e. variable frequency-divider means, to which the output of the gate means is applied. The variable frequency-divider means frequency-divides the output of the gate means by a first factor when the frequency dividing factor altering signal at the first level is applied to said control terminal, and frequency-divides the output of the gate means by a second factor when the frequency dividing factor altering signal at the second signal is applied thereto.

According to still another aspect of the present invention, the frequency-divider circuit is fabricated in a semiconductor integrated circuit form.

BRIEF DESCRIPTION OF DRAWINGS

FIGS. 13(a) through 13(g) show waveforms of various signals useful in explaining the operation of the variable frequency-dividing circuit of FIG. 3 when the first input alternating signal is applied thereto;

FIGS. 14(a) through 14(g) show waveforms of various signals useful in explaining the operation of the variable frequency-divider circuit of FIG. 3 when the second input alternating signal is applied thereto;

FIGS. 16(a) through 16(h) show waveforms of various signals useful in explaining the ÷64 frequency-dividing operation of the ÷64/÷65 frequency-divider of FIG. 15; and FIGS. 17(a) through 17(j) show waveforms of various signals useful in explaining the ÷65 frequency-dividing operation of the ÷64/÷65 frequency-divider of FIG. 15.

DETAILED DESCRIPTION OF PREFERRED EMBODIMENT

Figure 3:
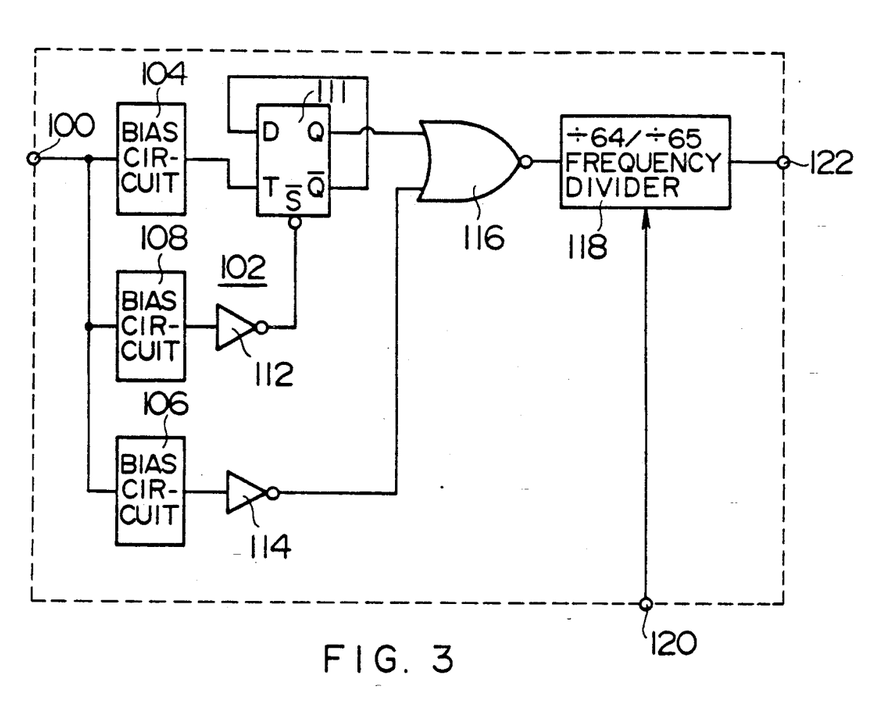
FIG. 3 is a block diagram of a variable frequency-divider circuit according to one embodiment of the present invention.

Referring to FIG. 3, a variable frequency-divider circuit according to an embodiment of the present invention is shown. The variable frequency-divider circuit according to the present invention includes an input terminal 100. The input terminal 100 is connected to judgment means 102, which includes three bias circuits 104, 106 and 108, and inverters 112 and 114.

Figure 5:
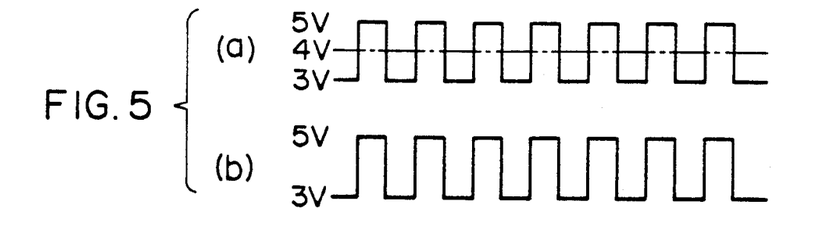
FIGS. 5(a) and 5(b) show waveforms of signals useful in explaining the operation of the bias circuit of FIG. 4 when a first input alternating signal is applied thereto.

When a first input alternating signal, shown, for example, in FIG. 5(a), which alternates about a first reference level, for example, 4 V, between a maximum value of, for example, 5 V and a minimum value of, for example, 3 V is applied to the input terminal 100, the bias circuit 104 develops at its output (first output point) a first output alternating signal, shown in FIG. 5(b), which has a maximum value of, for example, 5 V and a minimum value of, for example, 3 V.

Figure 6:
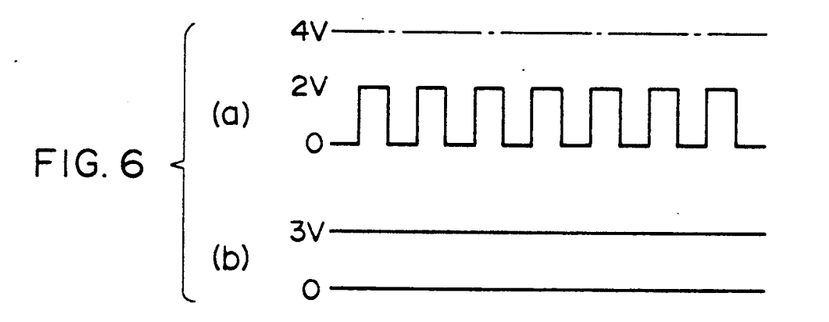
FIGS. 6(a) and 6(b) show waveforms of signals useful in explaining the operation of the bias circuit of FIG. 4 when a second input alternating signal is applied thereto.

When the input terminal 100 receives a second input alternating signal such as shown in FIG. 6(a), which alternates about a second reference level of, for example, 1 V between maximum and minimum values of, for example, 2 V and 0 V, respectively, both being less than the first reference level, and which has the same frequency as the first input alternating signal, the bias circuit 104 develops a signal at a constant level (L-level) of, for example, about 3 V, as shown in FIG. 6(b), at its output.

Figure 8:
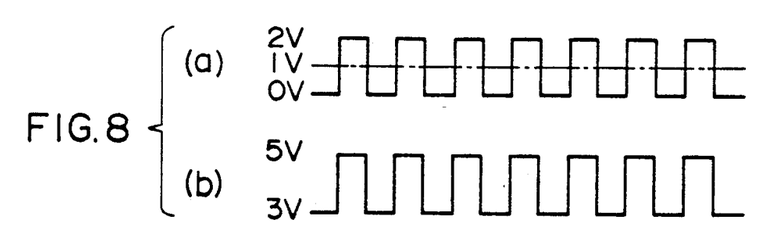
FIGS. 8(a) and 8(b) show waveforms of signals useful in explaining the operation of the bias circuit of FIG. 7 when a first input alternating signal is applied thereto.
Figure 9:
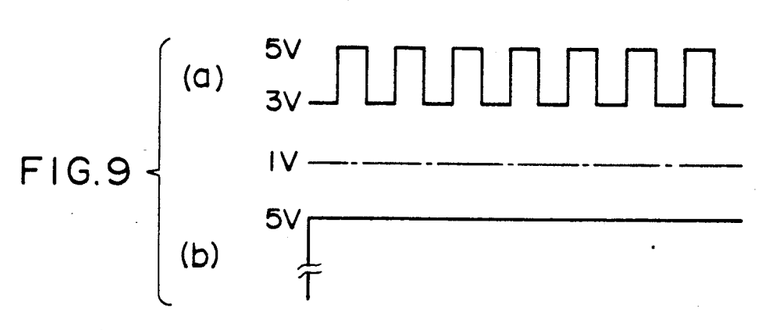
FIGS. 9(a) and 9(b) show waveforms of signals useful in explaining the operation of the bias circuit of FIG. 7 when a second input alternating signal is applied thereto.

The bias circuit 106 develops a second output alternating signal, such as one shown in FIG. 8(b), having a maximum value of, for example, 5 V and a minimum value of, for example, 3 V, when the second input alternating signal is applied to the input terminal 100. When the first input alternating signal shown in FIG. 9(a) is applied, the bias circuit 106 develops a gate control signal at a first level, for example, 5 V (H-level) shown in FIG. 9(b).

Figure 11:
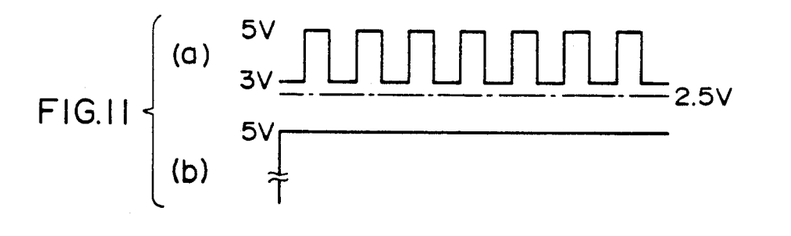
FIGS. 11(a) and 11(b) show waveforms of signals useful in explaining the operation of the bias circuit of FIG. 10 when a first input alternating signal is applied thereto.
Figure 12:
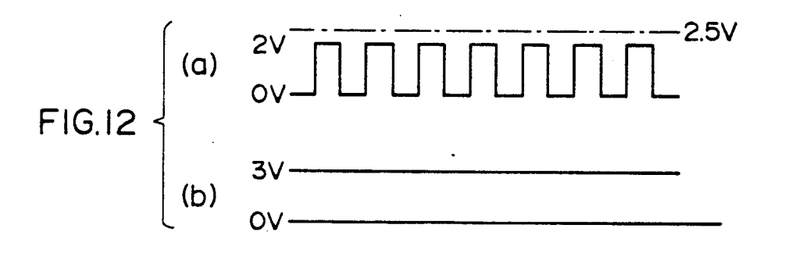
FIGS. 12(a) and 12(b) show waveforms of signals useful in explaining the operation of the bias circuit of FIG. 10 when a second input alternating signal is applied thereto.

The bias circuit 108 produces a frequency-division control signal at a first level (H-level) of, for example, 5 V as shown in FIG. 11(b), when the first input alternating signal, as shown in FIG. 11(a) is applied to the input terminal 100. It should be noted that the maximum and minimum values of this first input alternating signal are higher than a third reference level, for example, 2.5 V. The bias circuit 108 provides the frequency-division control signal at a second level (L-level) of, for example, about 3 V, as shown in FIG. 12(b), when the second input alternating signal, of which the maximum and minimum values are lower than the third reference level as shown in FIG. 12(a), is applied to the input terminal 100.

The first, second and third reference levels, and the circuit configurations of the bias circuits 104, 106 and 108 are described later in detail.

As shown in FIG. 3, the output of the bias circuit 104 is connected to a T input terminal of a D-type flip-flop 111 which provides frequency-divider means, for example, a divide-by-2 ($\div 2$) frequency-divider. The output signal of the bias circuit 108 is inverted by the inverter 112. The output signal of the inverter 112 is developed at its output terminal (i.e. third output point) and applied to an $\overline{S}$ input terminal of the D-type flip-flop 111. The output signal of the bias circuit 106 is inverted by the inverter 114, and the output signal of the inverter 114 at its output (i.e. second output point) is applied to one input of gating means, for example, a dual-input NOR gate 116.

A D-type flip-flop with $\overline{S}$ and $\overline{R}$ input terminals is well known, but the D-type flip-flop 111 does not have a reset function. When an input voltage higher than, for example, 2.5 V is applied to the $\overline{S}$ input terminal, the D-type flip-flop 111 treats this voltage as a H-level signal, and when an input voltage of lower than 2.5 V is applied, it treats this voltage as a L-level signal. When the $\overline{S}$ input terminal of the D-type flip-flop 111 is at the H-level, its Q and $\overline{Q}$ output terminals are placed at a L-level (0 V) and a H-level (5 V), respectively, regardless of input signals at D and T input terminals. The flip-flop 111 functions as a normal D-type flip-flop when the $\overline{S}$ input terminal is at the L-level. Specifically, at an instant a signal applied to the T input terminal rises, for example, a signal applied to the D input terminal is provided as the Q output. The $\overline{Q}$ output of the flip-flop 111 is connected to the D input terminal. Thus, the D-type flip-flop functions as a $\div 2$ frequency-divider which produces a signal divided in frequency by 2 (hereinafter referred to as $\div 2$ frequency-divided signal) at the Q output. The above-described connection of the D-type flip-flop 111 to enable it to act as a $\div 2$ frequency-divider is known.

Thus, the Q output of the D-type flip-flop 111 is the gate control signal when the $\overline{S}$ input terminal is at the H-level, and is the $\div 2$ frequency-divided signal when the $\overline{S}$ input terminal is at the L-level. The Q output of the D-type flip-flop 111 is coupled to the other input of the dual-input NOR gate 116. The dual-input NOR gate 116 treats a voltage higher than, for example, 2.5 V applied to it, as an H-level signal input, and treats a voltage lower than 2.5 V applied to it, as an L-level signal input. The output of the dual-input NOR gate 116 is applied to variable frequency-divider means (frequency-divider having a variable frequency dividing factor), for example, a divide-by-64/divide-by-65 frequency-divider ($\div 64/\div 65$ frequency-divider) 118. The $\div 64/\div 65$ frequency-divider 118 functions to divide the frequency of an input signal applied thereto by 64 when the H-level signal is applied to a control terminal 120 of the frequency-divider circuit, whereas it frequency-divides the input signal by 65 when the L-level signal is applied to the control terminal 120. The frequency-divided signal is provided to an output terminal 122 of the frequency-divider circuit.

Figure 13:
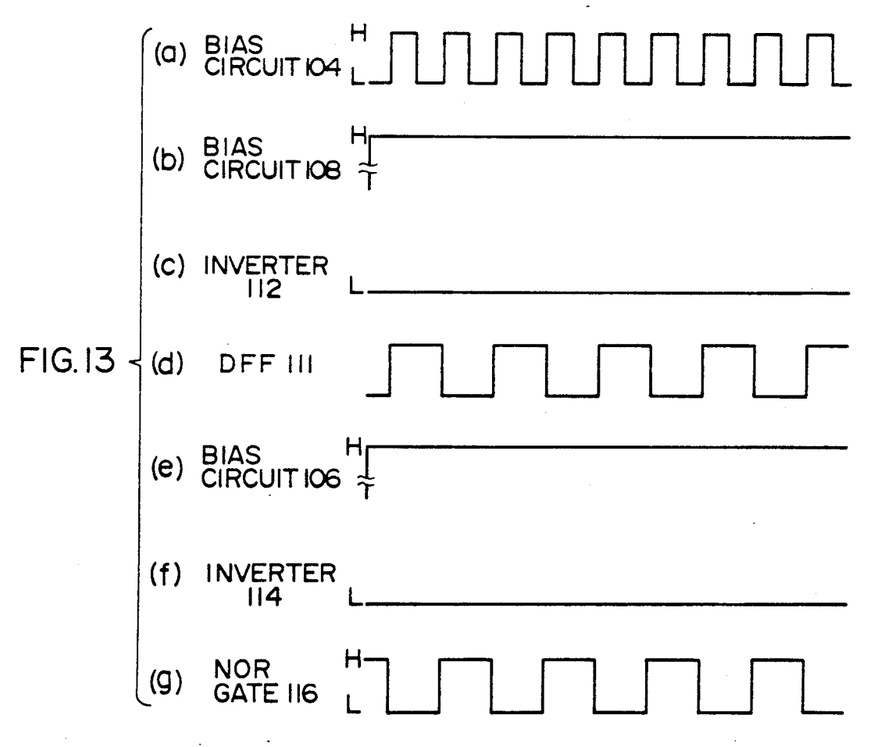

Now, let it be assumed that the first input alternating signal is applied to the input terminal 100. In this case, the bias circuit 104 provides the first output alternating signal as shown in FIG. 13(a), which is applied to the T input terminal of the D-type flip-flop 111. The bias circuit 108 provides the H-level frequency-division control signal as shown in FIG. 13(b), which is applied to the inverter 112 to become the L-level signal as shown in FIG. 13(c). This L-level signal is applied to the $\overline{S}$ input terminal of the D-type flip-flop 111. Accordingly, the D-type flip-flop 111 operates as an ordinary D-type flip-flop. The first alternating signal (FIG. 13(a)) applied to its T input terminal is divided by 2, as shown in FIG. 13(d). The frequency-divided signal is applied to the dual-input NOR gate 116. The inverter 112 is arranged to produce an H-level (5 V) signal when the L-level (3 V) is applied to it from the bias circuit 108, and to produce an L-level (0 V) signal when the H-level is applied to it from the bias circuit 108. The circuit configuration of the inverter 112 will be described in detail later.

Because the first input alternating signal is applied to the input terminal 100, the bias circuit 106 produces the H-level gate control signal shown in FIG. 13(e). This gate control signal is inverted by the inverter 114 to a L-level signal as shown in FIG. 13(f), which is then applied to the dual-input NOR gate 116. The inverter 114 provides an H-level (5 V) signal when an L-level (3 V) signal is applied thereto from the bias circuit 106, and provides an L-level (0 V) signal when an H-level (5 V) signal is applied thereto from the bias circuit 106. The details of the inverter 114 is described later.

It is known that the dual-input NOR gate 116 inverts a signal at one input thereof and provides the thus inverted signal as its output when a signal at the other input is at a L-level. Accordingly, as shown in FIG. 13(g), the dual-input NOR gate 116 provides, as its output, an inverted version of the signal at the Q output terminal of the D-type flip-flop 111, i.e. an inverted version of the first input alternating signal which has been frequency-divided by two, and the thus inverted Q output signal from the dual-input NOR gate 116 is applied to the ÷64/÷65 frequency-divider 118.

The ÷64/÷65 frequency-divider 118 performs a ÷64 (divide-by-64) frequency-division on an applied input signal when the frequency dividing factor altering signal at the H-level is applied to the control terminal 120. When the L-level signal is applied to the control terminal 120, the ÷64/÷65 frequency-divider 118 performs the ÷65 frequency-dividing operation. Thus, with the first input alternating signal applied to the input terminal 100 and with the H-level frequency dividing factor altering signal applied to the control terminal 120, the first input alternating signal which has been frequency-divided by 128 is available at the output terminal 122. On the other hand, when the L-level frequency dividing factor altering signal is applied to the control terminal 120 with the first input alternating signal applied to the input terminal 100, the first input alternating signal is divided in frequency by 130 and the thus frequency-divided signal is developed at the output terminal 122.

Figure 14:
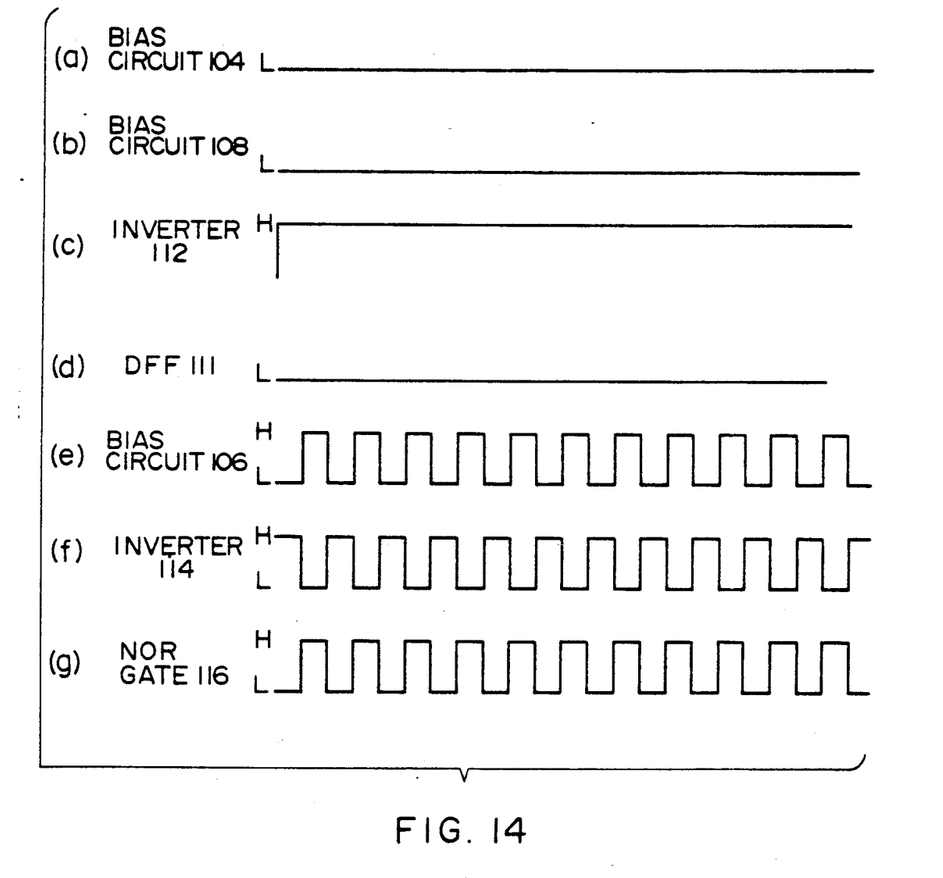

When the second input alternating signal is applied to the input terminal 100, the output of the bias circuit 104 is low, as shown in FIG. 14(a), the frequency-division control signal from the bias circuit 108 is also at the L-level, as shown in FIG. 14(b). This frequency-division control signal is inverted by the inverter 112 into an H-level signal shown in FIG. 14(c), which is applied to the $\bar{S}$ input terminal of the D-type flip-flop 111. Thus, the D-type flip-flop 111 develops a L-level signal, shown in FIG. 14(d) at the Q output terminal. This L-level signal is applied to the dual-input NOR gate 116 as the frequency-division control signal.

Since the second input alternating signal is being applied to the input terminal 100, the bias circuit 106 produces the second output alternating signal shown in FIG. 14(e), which is inverted by the inverter 114, as shown in FIG. 14(f), and applied to the dual-input NOR gate 116. As stated above, the dual-input NOR gate inverts an input signal at one input thereof and provides the inverted version as its output, when an input signal applied to the other input of the dual-input NOR gate 116 is at the L-level. Accordingly, the dual-input NOR gate 116 develops an inverted version of the output of the inverter 114, i.e. the second output alternating signal, as shown in FIG. 14(g), which is then applied to the ÷64/÷65 frequency-divider 118.

Under this condition, when the H-level signal is applied to the control terminal 120, the ÷64/÷65 frequency-divider 118 acts as a divide-by-64 frequency-divider. If, on the other hand, the L-level signal is applied to the control terminal 120, the ÷64/÷65 frequency-divider 118 acts as a divide-by-65 frequency-divider. Thus, with the second input alternating signal being applied to the input terminal 100 and with the H-level signal being applied to the control terminal 120, the second input alternating signal frequency-divided by 64 is provided at the output terminal 122, whereas the second input alternating signal frequency-divided by 65 is provided at the output terminal 122 when the L-level signal is applied to the control terminal 120 while the second input alternating signal is being applied to the input terminal 100.

As described above, according to the present invention, whether the D-type flip-flop 111 operates as a divide-by-two (÷2) frequency-divider or not is depending on whether the signal applied to the input terminal 100 of the variable frequency-divider circuit is the first input alternating signal or the second input alternating signal. Thus, there is no need to provide a terminal which would otherwise be required for applying a signal for determining whether or not the variable frequency-divider circuit should operate to divide the frequency of an input signal by two.

Figure 4:
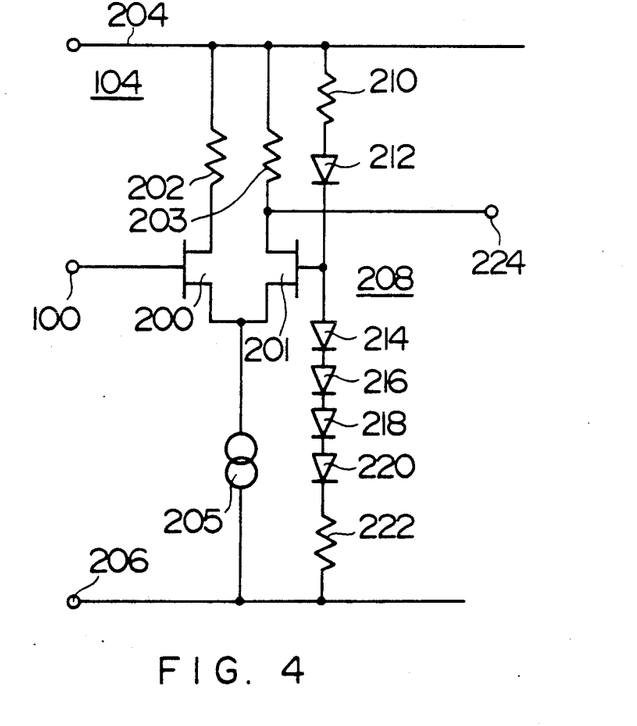
FIG. 4 is a circuit diagram of a first one of bias circuits used in the variable frequency-divider circuit of FIG. 3.

FIG. 4 shows an example of the bias circuit 104. The bias circuit 104 of FIG. 4 includes two MESFET's 200 and 201 which have their drains connected through resistors 202 and 203, respectively, to a positive voltage supply line 204. The sources of these transistors 200 and 201 are connected together to a reference potential point 206 through a constant current source 205. The gate of the MESFET 200 is connected to the input terminal 100 of the variable frequency-divider circuit, and the gate of the MESFET 201 is connected to a reference voltage generating circuit 208. Thus, the bias circuit 104 is configured as a differential amplifier.

The reference voltage generating circuit 208 includes a series combination of a resistor 210, diodes 212, 214, 216, 218 and 220 and a resistor 222 connected in the named order between the voltage supply line 204 and the refernce potential point 206 with the resistor 210 connected to the voltage supply line 204 and with the resistor 222 connected to the reference potential point 206. The junction between the diodes 212 and 214 is connected to the gate of the MESFET 201. The voltage between this junction and the reference potential point 206 is the first reference level (4 V). Where the voltage between the voltage supply line 204 and the reference potential point 206 is V, the voltage drop across each of the diodes 212–220 is $V_1$, the resistance value of the resistor 210 is r1, and the resistance value of the resistor 222 is r2, the current I flowing through the reference voltage generating circuit 208 is $$I = (V - 5V_1)/(r1 + r2)$$

and the first reference level $V_{ref1}$ is $$V_{ref1} = V - I \cdot r1 - V_1$$

Thus, the resistance values r1 and r2 are so determined that the first reference level $V_{ref1}$ of 4 volts is obtained.

The drain of the MESFET 201 is connected to an output point 224, which, in turn, is connected to the T input terminal of the D-type flip-flop 111 (FIG. 3). The voltage at the output point 224 is equal to the voltage V minus the voltage drop $V_2$ across the resistor 203.

The value of the current provided by the constant current source 205 and the resistance values of the resistors 202 and 203 are so determined that when the voltage at the input terminal 100 is 5 V, which is higher than the first reference level, the MESFET 200 is saturated and the MESFET 201 is cut off, and when the voltage at the input terminal 100 is 3 V or less, which is lower than the first reference level, the MESFET 200 is cut off and the MESFET 201 is saturated.

Thus, by choosing appropriate values for the constant current source 205 and the resistors 202 and 203, the bias circuit 104 can produce the first output alternating signal at the output point 224 when the first input alternating signal is applied to the input terminal 100, and can produce a signal at a constant level, 3 V, when the second input alternating signal is applied to the input terminal 100.

Figure 7:
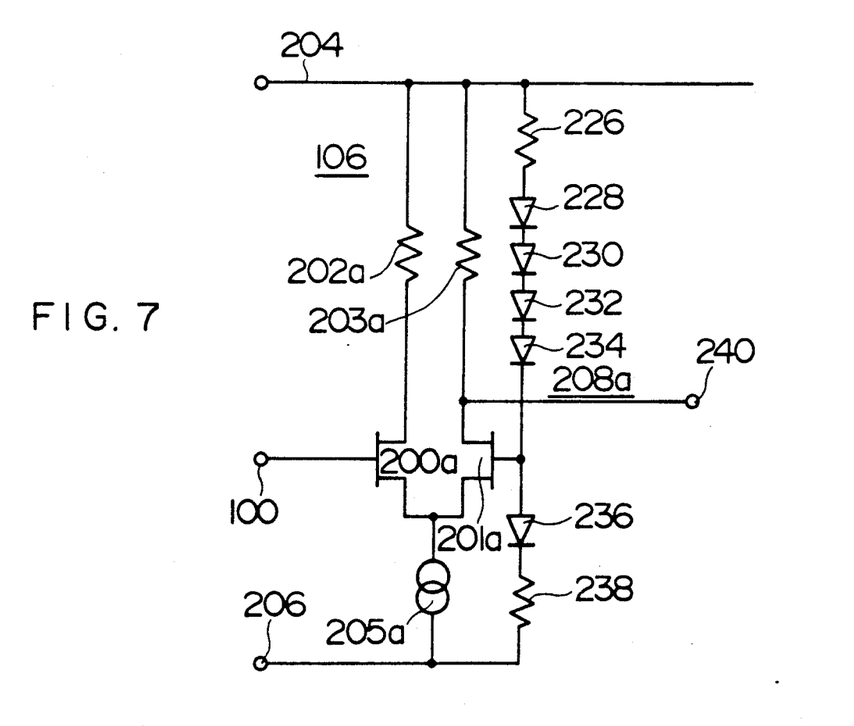
FIG. 7 shows a second one of the bias circuits used in the variable frequency-divider circuit of FIG. 3.

FIG. 7 shows an example of the bias circuit 106. The bias circuit 106 of FIG. 7 has a similar configuration to that of the bias circuit 104 except for the structure of the reference voltage generating circuit. The same reference numerals as those used in FIG. 4 represent the same components or functions, and reference numerals with a letter "a" represent components or functions corresponding to those in FIG. 4 having the same reference numerals without "a". Explanation of these components is not made, except for the reference voltage generating circuit 208a. The reference voltage generating circuit 208a includes a series combination of a resistor 226, diodes 228, 230, 232, 234 and 236, and a resistor 238 connected in the named order between the voltage supply line 204 and the reference potential point 206 with the resistor 226 connected to the voltage supply line 204 and with the resistor 238 connected to the reference potential point 206. The junction between the diodes 234 and 236 is connected to the gate of an MESFET 201a. As in the voltage generating circuit 208 of the bias circuit 104, the values of the resistors 226 and 238 are selected to provide a voltage of 1 V between the junction of the diodes 234 and 236 and the reference potential point 206. This voltage is the second reference level. The drain of the MESFET 201a is connected to an output point 240, which, in turn, is connected to the inverter 114 (FIG. 3).

The resistance values of resistors 202a and 203a and the current value of a constant current source 204a are appropriately selected so that the second output alternating signal is developed at the output point 240 when the second input alternating signal is applied to the input terminal 100, and develops a constant voltage of 5 V at the output point 240 when the first input alternating signal is applied to the input terminal 100.

Figure 10:
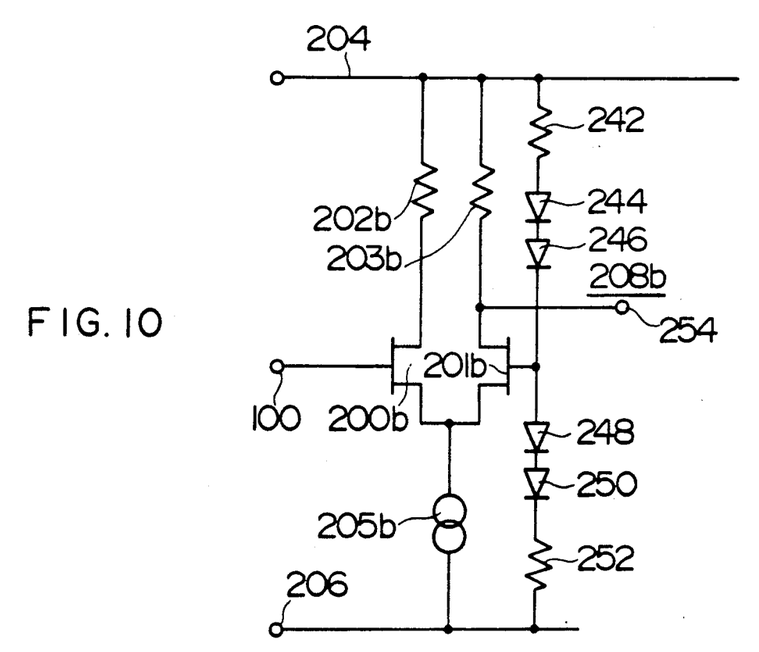
FIG. 10 is a circuit diagram of a third one of the bias circuits used in the variable frequency-divider circuit of FIG. 3.

FIG. 10 shows an example of the bias circuit 108. The bias circuit 108 is similar to the bias circuit 104 except for the configuration of its reference voltage generating circuit. The same reference numerals as those used in FIG. 4 represent the same components or functions, and reference numerals with a letter "b" represent corresponding components or functions as those in FIG. 4 having the same reference numerals without "b", and explanation about them is not made, except the reference voltage generating circuit 208b. The reference voltage generating circuit 208b includes a series combination of a resistor 242, diodes 244, 246, 248 and 250, and a resistor 252 connected in the named order between the voltage supply line 204 and the reference potential point 206 with the resistor 242 connected to the voltage supply line 204 and with the resistor 252 connected to the reference potential point 206. The junction of the diodes 246 and 248 is connected to the gate of an MESFET 201b. The values of the resistors 242 and 252 are selected such that the voltage between the junction of the diodes 246 and 248 and the reference potential point 206 is 2.5 V, which is the third reference level. The drain of the MESFET 201b is connected to an output point 254, which, in turn, is connected to the inverter 112 (FIG. 3).

The resistance values of resistors 202b and 203b and the current value of a constant current source 205b are selected such that a voltage of 5 V is developed at the output point 254 when the first input alternating signal is applied to the input terminal 100, and develops a voltage of 0 V at the output point 254 when the second input alternating signal is applied to the input terminal 100.

As is seen from the above descriptions, none of the bias circuits 104, 106 and 108 needs an AC grounding terminal.

Each of the inverters 112 and 114 has a configuration similar to that of the bias circuit 104 shown in FIG. 4, except that an output point corresponding to the output point 224 is connected to the drain of an MESFET corresponding to the MESFET 200 in order to provide an inverted output signal. A reference voltage generating circuit corresponding to the circuit 208 is arranged to provide a reference voltage of 4 V. The resistance values of resistors corresponding to the resistors 202 and 203 and the current value of a constant current source corresponding to the constant current source 205 are selected such that a voltage of 0 V is developed at the output point when a voltage of 5 V, which is higher than the reference voltage, is applied to an input terminal of that inverter and, accordingly, MESFET's corresponding to the MESFET's 200 and 201 are saturated and cut off, respectively, and that a voltage of 5 V is developed at the output point when a voltage of 3 V, which is less than the reference voltage, is applied to the input terminal so that the MESFET's corresponding to the MESFET's 200 and 201 are cut off and saturated, respectively.

Figure 15:
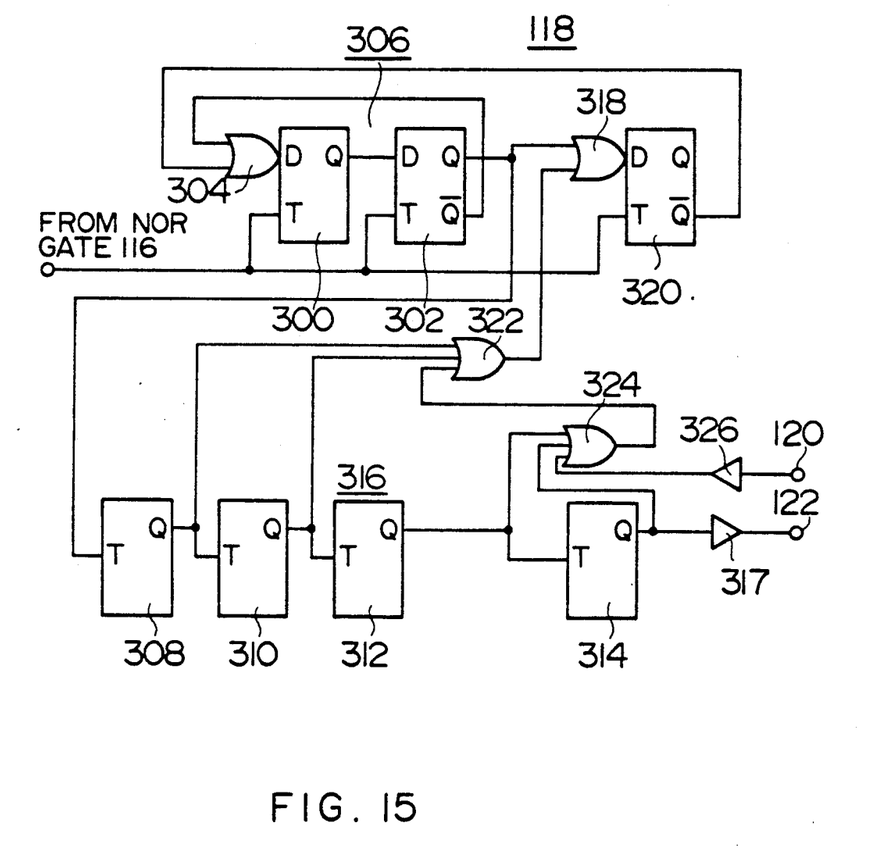
FIG. 15 is a block diagram of a ÷64/÷65 frequency-divider which may be used in the variable frequency-divider circuit of FIG. 3.

FIG. 15 shows an example of the $\div 64/\div 65$ frequency-divider 118. This frequency-divider includes a quaternary Johnson counter 306 which comprises D-type flip-flops 300 and 302 and an OR gate 304. The Q output terminal of the D-type flip-flop 300 is coupled to the D input terminal of the D-type flip-flop 302. The $\overline{Q}$ output terminal of the flip-flop 302 is coupled to the D input terminal of the flip-flop 300 through the OR gate 304. The output from the NOR gate 116 (FIG. 3) is coupled to the T input terminals of the respective D-type flip-flop 300 and 302.

The frequency-divider 118 includes further an asynchronous hexadecimal down counter 316 which comprises four T-type flip-flops 308, 310, 312 and 314. The last stage of the Johnson counter 306, i.e. the Q output terminal of the D-type flip-flop 302, is coupled to the first stage of the down counter 316, i.e. the T input terminal of the T-type flip-flop 308. The Q output terminal of the T-type flip-flop 314 is connected through a buffer 317 to the output terminal 122 of the variable frequency-divider circuit.

The Q output of the D-type flip-flop 302 is coupled through an OR gate 318 to the D input terminal of a D-type flip-flop 320 of which the $\overline{Q}$ output is coupled through the OR gate 304 to the D input terminal of the D-type flip-flop 300. The Q output terminals of the D-type flip-flops 308 and 310 are coupled through an OR gate 322 and the OR gate 318 to the D input terminal of the D-type flip-flop 320. Also, the Q output terminals of the T-type flip-flops 312 and 314 are coupled through an OR gate 324 and the OR gates 322 and 318 to the D input terminal of the D-type flip-flop 320. The frequency dividing factor altering signal from the control terminal 120 is coupled through a buffer 326 and the OR gates 324, 322 and 318 to the D input of the D-type flip-flop 320.

Figure 16:
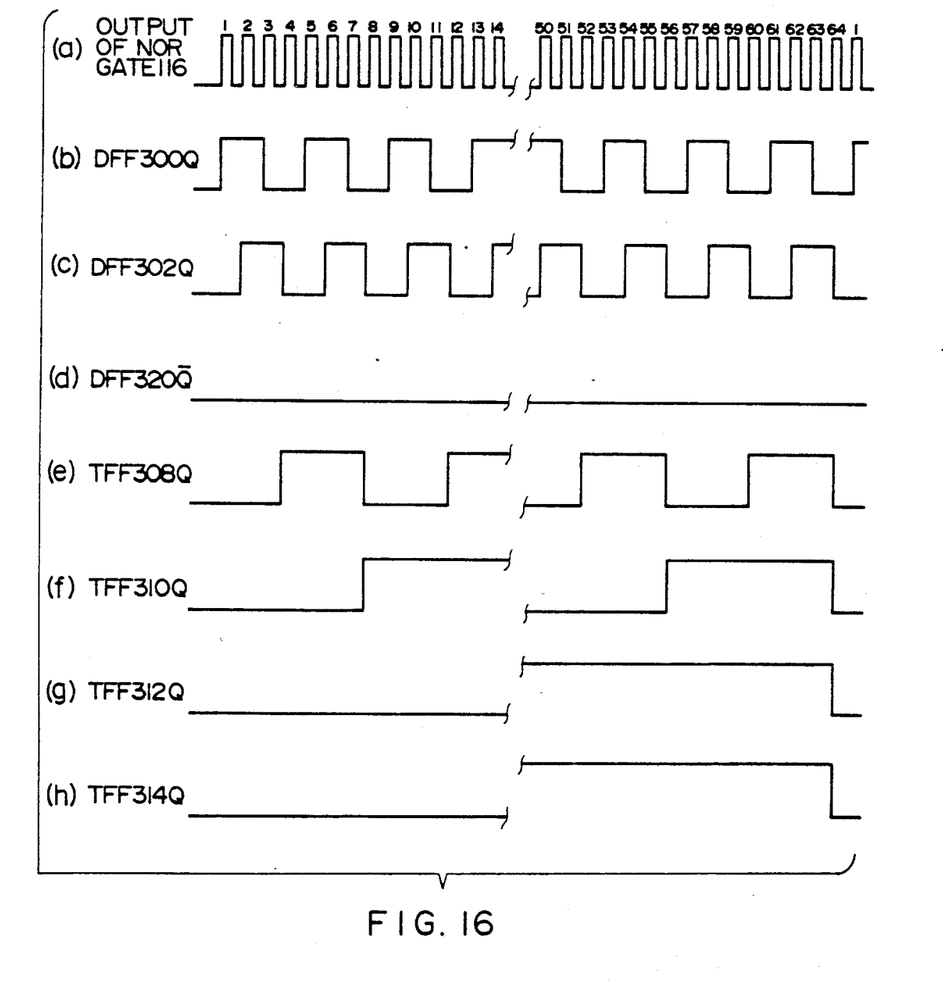

Signal timing for the frequency-divider 118 when operating as a divide-by-64 (÷64) frequency-divider is shown in FIG. 16. Since the frequency dividing factor altering signal at the H-level is coupled through the control terminal 120 to the D input terminal of the D-type flip-flop 320, the $\overline{Q}$ output of the D-type flip-flop 320 is always at the L-level, as shown in FIG. 16(d), and, therefore, it does not affect the operation of the Johnson counter 306. Let it be assumed that initially the Q output of the D-type flip-flop 300 is at the L-level, as shown in FIG. 16(b), and the Q and $\overline{Q}$ outputs of the D-type flip-flop 302 are at the L-level and H-level, respectively, as is seen from FIG. 16(c). Then, as is seen from FIGS. 16(a) through 16(c), the Q output of the D-type flip-flop 302 of the Johnson counter 306 falls as every fourth output pulse occurs from the NOR gate 116. The operation of the Johnson counter 306 is known and, therefore, it is not explained further.

In response to a falling edge of the Q output of the D-type flip-flop 302, the hexadecimal down counter 316 down-counts, as is shown in FIGS. 16(e) through 16(h). Since the down-counting operation is known, its detailed explanation is not made. Thus, when the NOR gate 116 provides the sixty-fourth output pulse, the Q output of the T-type flip-flop 314 changes to the L-level. Thus, the output signal from the NOR gate 116 is frequency-divided by 64.

Figure 17:
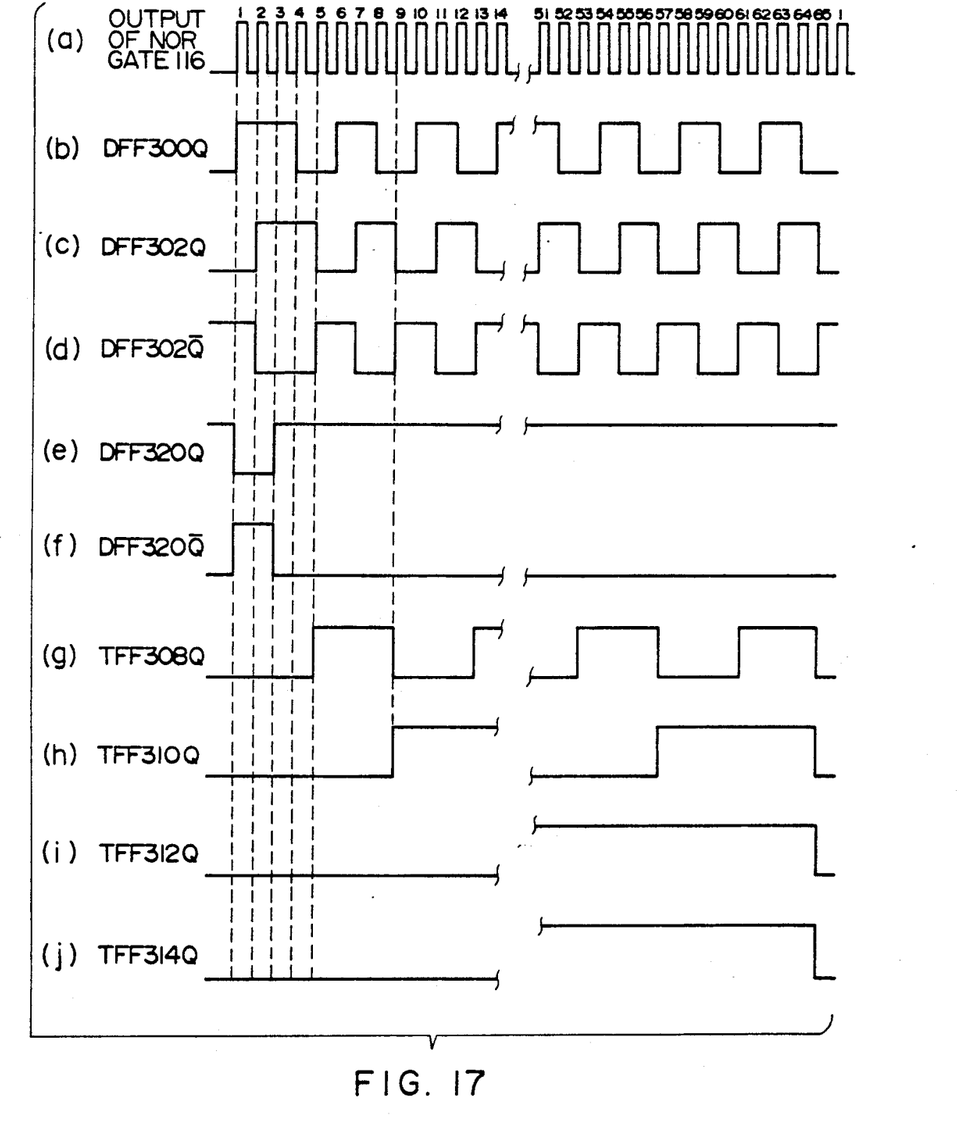

FIG. 17 shows signal timing when the frequency-divider 118 operates as a divide-by-65 frequency-divider. In this case, the frequency dividing factor altering signal being applied to the control terminal 120 is at the L-level. Let it be assumed that the Q output of the D-type flip-flop 300 is at the L-level as shown in FIG. 17(b), the Q output of the D-type flip-flop 302 is at the L-level as shown in FIG. 17(c), the $\overline{Q}$ output of the flip-flop 302 is at the H-level as shown in FIG. 17(d), the Q output of the D-type flip-flop 320 is at the H-level as shown in FIG. 17(e), the $\overline{Q}$ output of the flip-flop 320 is at the L-level as shown in FIG. 17(f), and the Q outputs of the respective T-type flip-flops 308, 310, 312 and 314 are at the L-level as shown in FIGS. 17(g) through 17(j).

Under these conditions, when the first output pulse is generated by the NOR gate 116 as shown in FIG. 17(a), the Q output of the D-type flip-flop 300 changes to the H-level because the $\overline{Q}$ output of the D-type flip-flop 302 is at the H-level. On the other hand, the Q and $\overline{Q}$ outputs of the D-type flip-flop 302 remain low and high, respectively, since the Q output of the D-type flip-flop 300 immediately before the occurrence of the first output pulse from the NOR gate 116 is at the L-level. Also, the Q and $\overline{Q}$ outputs of the D-type flip-flop 320 change respectively to the L-level and H-level because the Q output of the D-type flip-flop 302 immediately before the occurrence of the first output pulse from the NOR gate 116 is at the L-level.

Upon the occurrence of the second output pulse from the NOR gate 116, the Q output of the flip-flop 300 remains at the H-level because the $\overline{Q}$ outputs of both D-type flip-flops 302 and 320 immediately before the occurrence of the second output pulse from the NOR gate 116 are at the H-level. The Q and $\overline{Q}$ outputs of the flip-flop 302 change to the H-level and L-level, respectively, because the Q output of the flip-flop 300 immediately before the second output pulse from the NOR gate 116 is at the H-level. Further, the Q and $\overline{Q}$ outputs of the flip-flop 320 change to the L-level and H-level, respectively, because the Q output of the D-type flip-flop 302 immediately before the occurrence of the second output pulse from the NOR gate 116 is at the L-level.

Upon the occurrence of the third output pulse from the NOR gate 116, the Q output of the D-type flip-flop 300 remains at the H-level because the $\overline{Q}$ output of the D-type flip-flop 320 immediately before the occurrence of the third output pulse is at the H-level. Because the Q output of the flip-flop 300 immediately before the occurrence of the third output pulse is at the H-level, the Q and $\overline{Q}$ outputs of the flip-flop 302 are maintained at the H-level and L-level, respectively. Further, because the Q output of the flip-flop 302 immediately before the occurrence of the third output pulse from the NOR gate 116 is at the H-level, the Q and $\overline{Q}$ outputs of the flip-flop 302 change to the H-level and L-level, respectively.

When the NOR gate 116 produces the fourth output pulse, the Q output of the flip-flop 300 changes to the L-level because the $\overline{Q}$ outputs of the flip-flops 302 and 320 are both at the L-level. The Q and $\overline{Q}$ outputs of the flip-flop 302 are maintained at the H-level and L-level, respectively, because the Q output of the flip-flop 300 immediately before the occurrence of the fourth output pulse is at the H-level. Immediately before the fourth output pulse is provided from the NOR gate 116, the Q output of the flip-flop 302 is at the H-level, and, accordingly, when the fourth output pulse occurs, the Q and $\overline{Q}$ outputs of the D-type flip-flop 320 remain at the H-level and L-level, respectively.

When the fifth output pulse is provided by the NOR gate 116. the Q outputs of the flip-flop 300 remains at the L-level because the $\overline{Q}$ outputs of the flip-flops 302 and 320 are both at the L-level. On the other hand, the Q and $\overline{Q}$ outputs of the flip-flop 302 change to the L-level and H-level, respectively, because the Q output of the flip-flop 300 immediately before the occurrence of the fifth output pulse is at the L-level. In other words, the Q output of the D-type flip-flop 302 falls to the L-level when the NOR gate 116 provides the fifth output pulse. Further, because the Q output of the flip-flop 302 immediately before the occurrence of the fifth output pulse is at the H-level, the Q and $\overline{Q}$ outputs of the flip-flop 320 remain at the H-level and L-level, respectively. Because of the falling of the Q output of the flip-flop 302 to the L-level, the Q output of the T-type flip-flop 308 changes to the H-level, as shown in FIG. 17(g).

The Q output at the H-level of the T-type flip-flop 308 is coupled through the OR gates 322 and 318 to the D input terminal of the D-type flip-flop 320. Accordingly, the Q and $\overline{Q}$ outputs of the flip-flop 320 remain at the H-level and the L-level, respectively, during a time interval when the Q output of the T-type flip-flop 308 is at the H-level, and they do not affect the operation of the D-type flip-flops 300 and 302. Consequently, the D-type flip-flops 300 and 302 operate as a known quaternary Johnson counter 306. Thus, the Q output of the D-type flip-flop 302 falls to the L-level when the fourth pulse from the fifth pulse, i.e. the ninth output pulse is provided by the NOR gate 116. In response to the falling of the Q output of the flip-flop 302, the Q output of the T-type flip-flop 308 falls as shown in FIG. 17(g) and the Q output of the T-type flip-flop 310 rises to the H-level as shown in FIG. 17(h).

The H-level Q output of the T-type flip-flop 310 is applied through the OR gates 322 and 318 to the D input terminal of the D-type flip-flop 320 to thereby maintain the Q and $\overline{Q}$ outputs of the flip-flop 320 in such states as to not affect the operation of the D-type flip-flop 302. Thus, the rising of the Q outputs of the T-type flip-flops 308 and 310 ensures that the D-type flip-flops 300 and 302 operate as a Johnson counter. Thereafter, the operation of the D-type flip-flops 300 and 302 as a Johnson counter is assured by the rising of the Q outputs of the T-type flip-flops 312 and 314.

Thus, the D-type flip-flop 302 lowers its output level only when the NOR gate 116 produces the fifth output pulse, and, thereafter, lowers its output level every fourth output pulse from the NOR gate 116. The Q output of the D-type Flip-flop 302 is counted by the hexadecimal down counter 316, and, accordingly, the Q output of the T-type flip-flop 314 falls to the L-level upon the occurrence of the sixty-fifth output pulse from the NOR gate 116. This means that the circuit 118 has frequency-divided the output pulse from the NOR gate 116 by 65.

The present invention is not limited by the above-described embodiment, but various modifications may be contemplated. For example, in place of the NOR gate 116, an EXNOR gate or an EXOR gate may be used. A D-type flip-flop with an $\overline{R}$ function may be used instead of the D-type flip-flop 111 with an $\overline{S}$ function. In this case, the Q output of the D-type Flip-flop 111 will be at the H-level, and, therefore, and AND gate is used in place of the NOR gate 116 and the inverter 114 is removed. Furthermore, in the above-described embodiment, the output of the bias circuit 104 is coupled to the T input terminal of the D-type flip-flop 111 and the output of the bias circuit 106 is coupled to the inverter 114, but this connection may be reversed. That is, the output of the bias circuit 104 may be applied to the inverter 114 with the output of the bias circuit 106 applied to the T input terminal of the D-type flip-flop 111.

What is claimed is:

1. A frequency-divider circuit comprising:
   a single input terminal to which a first input alternating signal alternating about a first reference level or a second input alternating signal alternating about a second reference level different from said first reference level is applied;
   judgement means coupled to said input terminal, having first, second and third output points, said judgement means producing a first output alternating signal at said first output point, a first gate control signal at said second output point and a frequency-division control signal at a first level at said third output point when said first input alternating signal is applied to said input terminal, and producing a second output alternating signal at said second output point and the frequency-division control signal at a second level at said third output point when a second input alternating signal is applied to said input terminal;
   frequency divider means for producing a frequency-divided signal by frequency-dividing the first output alternating signal from said first output point by a predetermined factor when the frequency-division control signal at the first level is applied thereto from said third output point, and producing a second gate control signal when the frequency-division control signal at the second level is applied thereto from said third output point; and
   gate means for receiving an output signal from said frequency-divider means and an output signal from the second output point of said judgment means, for allowing said frequency-divided signal to pass therethrough when the output signal from said frequency-divider means is said frequency-divided signal and the output signal from said second output point of said judgment means is said first gate control signal, and for allowing said second output alternating signal to pass therethrough when the output signal from said frequency-divider means is said second gate control signal and the output signal from said second output point of said judgment means is said second output alternating signal.

2. A frequency-divider circuit according to Claim 1, further comprising:
   a control terminal to which frequency dividing factor switching signals at first and second levels are selectively applied; and
   variable frequency-dividing-factor frequency-divider means to which an output signal from said gate means and a frequency dividing factor switching signal from said control terminal are applied, said variable frequency-dividing-factor frequency-divider means frequency dividing the output signal from said gate means by a first frequency dividing factor when the frequency dividing factor switching signal at the first level is applied thereto, and frequency dividing the output signal from said gate means by a second frequency dividing factor when the frequency dividing factor switching signal at the second level is applied thereto.

3. A frequency-divider circuit according to claim 1 wherein said circuit is an integrated circuit.

4. A frequency-divider circuit according to claim 2 wherein said circuit is an integrated circuit.

5. A frequency-divider circuit according to claim 1 wherein said judgment means comprises:
   first means for producing said first output alternating signal at said first output point when said first input alternating signal is applied to said input terminal, and producing a signal at a fixed level at said first output point when said second input alternating signal is applied to said input terminal;
   second means for producing said first gate control signal at said second output point when said first input alternating signal is applied to said input terminal, and producing said second output alternating signal at said second output point when said second input alternating signal is applied to said input terminal; and
   third means for producing said frequency-division control signal at the first level at said third output point when said first input alternating signal is applied to said input terminal, and producing said frequency-division control signal at the second level at said third output point when said second input alternating signal is applied to said input terminal.

6. A frequency-divider circuit according to claim 5, further comprising:
   a control terminal to which frequency dividing factor switching signals at first and second levels are selectively applied; and
   variable frequency-dividing-factor frequency-divider means to which an output signal from said gate means and a frequency dividing factor switching signal from said control terminal are applied, said variable frequency-dividing-factor frequency-divider means frequency dividing the output signal from said gate means by a first frequency dividing factor when the frequency dividing factor switching signal at the first level is applied thereto, and frequency dividing the output signal from said gate means by a second frequency dividing factor when the frequency dividing factor switching signal at the second level is applied thereto.

7. A frequency-divider circuit according to claim 5 wherein said circuit is an integrated circuit.

8. A frequency-divider circuit according to claim 6 wherein said circuit is an integrated circuit.

9. A frequency-divider circuit according to claim 5 wherein each of said first, second and third means of said judgment means comprises differential amplifier means having first and second inputs and an output;

the first inputs of said differential amplifier means of said first, second and third means being connected to said input terminal of said frequency-divider circuit;

said differential amplifier means of said first means having a second input connected to an associated reference signal generating means which provides said first reference level, and having its output connected to said first output point;

said differential amplifier means of said second means having its second input connected to an associated reference signal generating means which provides said second reference level, and having its output connected to said second output point; and said differential amplifier means of said third means having its second input connected to an associated reference signal generating means which provides a third reference level located between said first and second reference levels, and having its output connected to said third output point.

10. A frequency-divider circuit according to claim 9, further comprising:

a control terminal to which frequency dividing factor switching signals at first and second levels are selectively applied; and variable frequency-dividing-factor frequency-divider means to which an output signal from said gate means and a frequency dividing factor switching signal from said control terminal are applied, said variable frequency-dividing-factor frequency-divider means frequency dividing the output signal from said gate means by a first frequency dividing factor when the frequency dividing factor switching signal at the first level is applied thereto, and frequency dividing the output signal from said gate means by a second frequency dividing factor when the frequency dividing factor switching signal at the second level is applied thereto.

11. A frequency-divider circuit according to claim 9 wherein said circuit is an integrated circuit.

12. A frequency-divider circuit according to claim 10 wherein said circuit is an integrated circuit.

13. A frequency-divider circuit responsive to an input signal comprising:

first means, responsive to said input signal having a first condition including varying between first and second voltage levels, for dividing said input signal by a first factor and outputting a first divided output signal to an output; and second means, responsive to said input signal having a second condition including varying between third and fourth voltage levels, for dividing said input signal by a second factor and outputting a second divided output signal, different from the first, to said output.

14. Apparatus according to claim 13 wherein:

said first and second means include:

dividing means, responsive to a mode switching signal being in a first state, for permitting said first means and said second means to divide said input signal by one of said first and second factors, respectively when said mode switching signal is in said first state and said input signal is in one of said first condition and said second condition respectively; and said dividing means having a mode switching means, responsive to said mode switching signal being in a second state, for changing said first and second factors to third and fourth factors, respectively, when said mode switching signal is in a second state.

15. Apparatus according to claim 13, wherein:

said first and second means include a frequency divider;

said first means includes a flip flop and means for triggering said flip flop by said input signal when said input signal has said first condition and applying an output of said flip flop to said frequency divider, whereby said first factor includes a factor of two times a dividing ratio of said frequency divider; and said second means being effective for passing said input signal to said frequency divider when said input signal has said second condition, whereby said second factor includes a factor of one times said dividing ratio of said frequency divider.

16. Apparatus according to claim 15, wherein said frequency divider includes:

mode switching means for setting said dividing ratio to one of a first dividing factor and a second dividing factor when a mode switching signal is in one of a first state and a second state, respectively.

17. A frequency divider circuit comprising:

a frequency divider;

said frequency divider including means, responsive to a mode switching signal for dividing a signal input to it by first and second different dividing factors;

distributing means for distributing an input signal having one of a first and second conditions;

said first condition including variation between first and second voltage levels;

said second condition including variation between third and fourth voltage levels not overlapping said first and second voltage levels;

first means, having a flip flop, responsive to said input signal having said first condition for triggering said flip flop with said input signal and for connecting an output of said flip flop to trigger said frequency divider; and second means responsive to said input signal having said second condition for triggering said frequency divider in step with said input signal, whereby a frequency division in the presence of said first condition is twice a frequency division in the presence of said second condition.

* * * * *